(12) United States Patent
Terrovitis

(10) Patent No.: US 7,439,776 B1
(45) Date of Patent: Oct. 21, 2008

(54) TECHNIQUE TO INCREASE THE SPEED OF A PEAK DETECTOR

(75) Inventor: Manolis Terrovitis, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 22 days.

(21) Appl. No.: 11/279,862

(22) Filed: Apr. 14, 2006

(51) Int. Cl.
*H03K 5/153* (2006.01)

(52) U.S. Cl. .......................... 327/58; 327/59; 330/252; 330/288

(58) Field of Classification Search ................ None
See application file for complete search history.

(56) References Cited

U.S. PATENT DOCUMENTS

| | | | | |
|---|---|---|---|---|
| 3,699,357 A * | 10/1972 | Lloyd | ........................... | 327/59 |
| 3,714,464 A * | 1/1973 | Nutt | ........................... | 327/61 |
| 4,321,488 A * | 3/1982 | Srivastava | ........................... | 327/96 |
| 4,603,299 A * | 7/1986 | Monett | ........................... | 327/58 |
| 4,605,867 A * | 8/1986 | Veehof | ........................... | 327/59 |
| 5,828,240 A * | 10/1998 | Smith | ........................... | 327/62 |
| 6,201,419 B1 * | 3/2001 | Kamei | ........................... | 327/77 |
| 7,109,466 B2 * | 9/2006 | Park et al. | ........................... | 250/214 A |
| 2006/0208768 A1 * | 9/2006 | Momtaz et al. | ........................... | 327/58 |

* cited by examiner

*Primary Examiner*—Tuan T. Lam
*Assistant Examiner*—Hiep Nguyen
(74) *Attorney, Agent, or Firm*—Bever, Hoffman & Harms, LLP; Jeanette S. Harms

(57) ABSTRACT

A peak detector can advantageously increase its bandwidth, i.e. its charging and discharging speed, while minimizing the ripple of its output signal by sensing the charging current of a storage device. In response to that charging current, the peak detector can control a discharge current, thereby accelerating its response. For example, the peak detector can reduce a discharge current in response to an increased charging current (which indicates a charging phase) and increase the discharge current in response to a decreased charging current (which indicates a discharge phase).

8 Claims, 4 Drawing Sheets

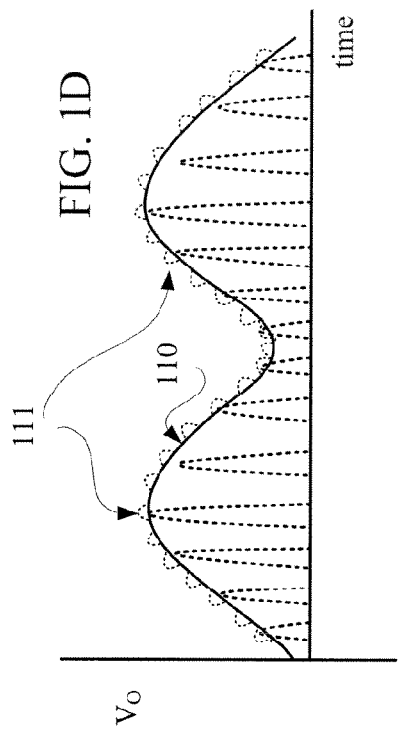
FIG. 1D
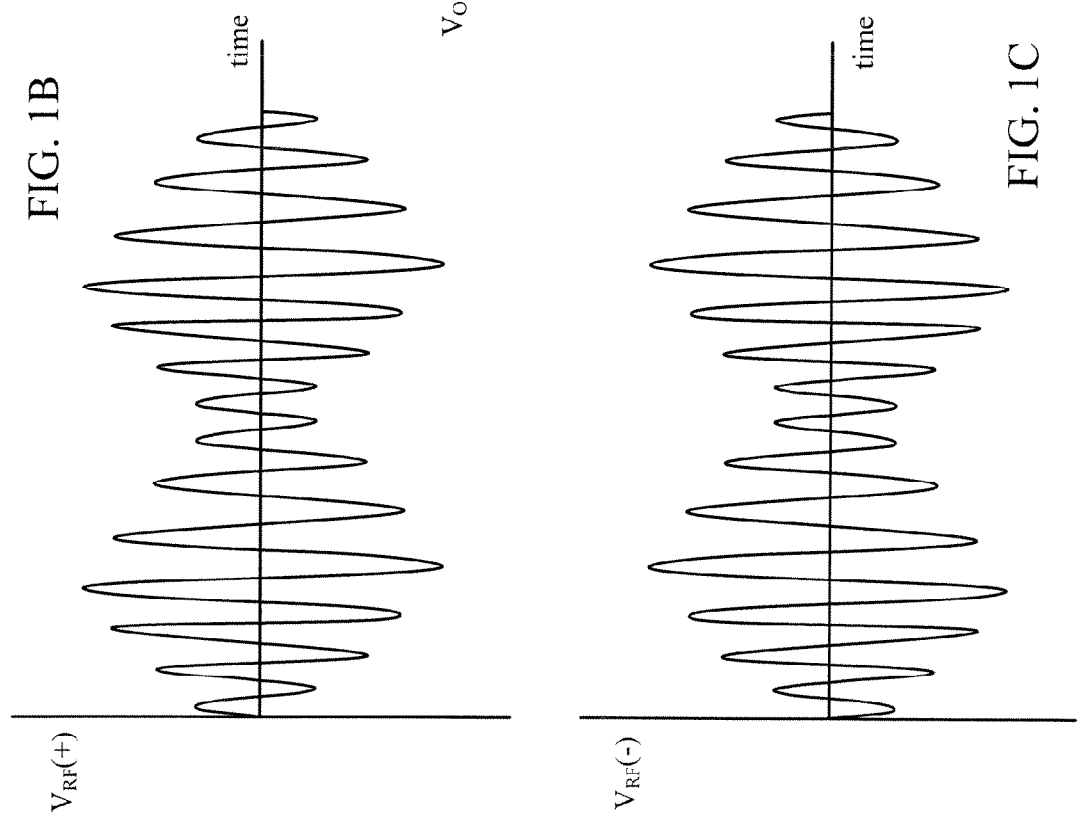
FIG. 1B
FIG. 1C

TECHNIQUE TO INCREASE THE SPEED OF A PEAK DETECTOR

BACKGROUND OF THE INVENTION

1. Field of the Invention

The present invention relates to increasing the speed of a peak detector while minimizing ripple on its output.

2. Description of the Related Art

FIG. 1A illustrates a typical peak detector 100. The RF differential signal $V_{RF}(+)$ and $V_{RF}(-)$, whose envelope must be detected, is connected to the gates of NMOS transistors 101 and 102. Transistors 101 and 102 are connected in parallel between a voltage source VDD and a node 103, which provides an output signal $V_o$. An NMOS transistor 105 and a capacitor 106 are connected in parallel between node 103 and a voltage source VSS. In a separate path, a current source 107 and an NMOS transistor 104 are connected in series between voltage sources VDD and VSS. Current source 107 provides a bias current $I_B$. The drain and gate of NMOS transistor 104 are connected to the gate of NMOS transistor 105, thereby ensuring that NMOS transistor 105 is also on and the bias current $I_B$ is provided at node 103.

In this configuration, when the input peak voltage exceeds $V_o + V_t$, where $V_t$ is the threshold voltage of transistors 101 and 102, NMOS transistors 101 and 102 turn on and current flows through those transistors, thereby charging capacitor 106 and increasing the output signal $V_o$. In contrast, when the input peak voltage is equal to or less than $V_o | V_t$, NMOS transistors 101 and 102 turn off and capacitor 106 discharges. As a result, the output signal $V_o$ decreases due to the constant leakage caused by bias current $I_B$ through NMOS transistor 105. Note that both NMOS transistors 104 and 105 are constant current devices that always carry bias current $I_B$.

FIGS. 1B and 1C respectively illustrate exemplary graphs of $V_{RF}(+)$ and $V_{RF}(-)$ over time. FIG. 1D illustrates a graph of an envelope 110 of the differential signal, i.e. $V_{RF}(+)$ and $V_{RF}(-)$, as measured by the output signal $V_o$. As shown in FIGS. 1B, 1C, and 1D, the peak amplitude of each current pulse in $V_o$ is proportional to the peak amplitude of the differential signal during that particular conducting half cycle. Thus, the peak values of the output current pulses follow the amplitude of the differential signal during conducting half cycles and have the same waveform as envelope 110. Note that in steady state, when the amplitude of the RF differential signal is constant, NMOS transistors 101 and 102 turn on for a small part of the period, which is enough to provide the charge that is removed by bias current $I_B$. Unfortunately, this periodic charging of capacitor 106 can result in a ripple 111 (FIG. 1D) on the output signal $V_o$, which is generally undesirable.

In some applications, it is desirable to obtain a fast response from peak detector 100 when envelope 110 of the RF differential signal changes. For a given size of capacitor 106, a fast charge can be achieved by making NMOS transistors 101 and 102 large. A fast discharge can be achieved by making the bias current $I_B$ high. Unfortunately, when transistors 101 and 102 are large and the bias current $I_B$ is high, a large ripple appears on the output signal $V_o$.

Therefore, a need arises for a peak detector that can handle high bandwidth, i.e. ensure fast detector response, while minimizing ripple on the output signal.

BRIEF DESCRIPTION OF THE FIGURES

FIGS. 1B and 1C respectively illustrate exemplary graphs of $V_{RF}(+)$ and $V_{RF}(-)$ over time.

FIG. 1D illustrates a graph of an envelope of the differential signal, i.e. $V_{RF}(+)$ and $V_{RF}(-)$, as measured by the output signal $V_o$.

SUMMARY OF THE INVENTION

Figure 1A:
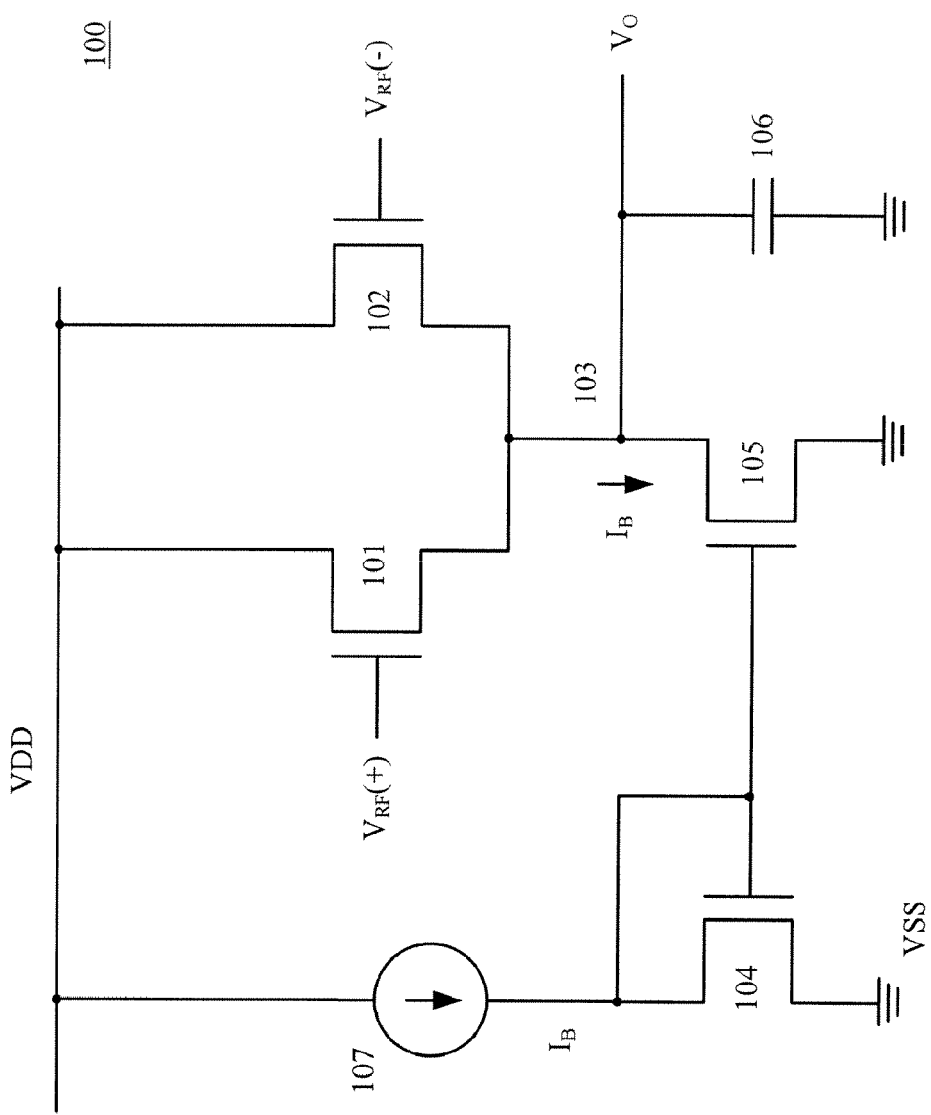
FIG. 1A illustrates a typical prior art peak detector.

A peak detector can advantageously increase its bandwidth, i.e. its charging and discharging speed, while minimizing the ripple of its output signal by sensing the charging current of a storage device. In response to that charging current, the peak detector can control a discharge current, thereby accelerating its response. For example, the peak detector can reduce a discharge current in response to an increased charging current (which indicates a charging phase) and increase the discharge current in response to a decreased charging current (which indicates a discharge phase).

More specifically, an exemplary technique used by this peak detector can include receiving a differential signal, wherein a change in a peak of the differential signal initiates a charge/discharge of a storage device (e.g. a capacitor). If a charge of the storage device is detected, then a current through an active discharge device connected to the storage device can be decreased, thereby accelerating charging. In contrast, if an absence of charging of the storage device is detected, thereby effectively detecting a discharge of the storage device, then the current through the active discharge device can be increased, thereby accelerating discharging. In one embodiment, reducing or increasing current through the active discharge device can include directing a current provided by a current source to two transistors, wherein a current through one of the two transistors directly controls the active discharge device.

In one embodiment, the peak detector can include a differential signal input circuit, a storage device, an active discharge device, and a control circuit. The storage device can charge/discharge based on a charging current provided by the differential signal input circuit. The sensing device can advantageously sense this charging current. The control circuit, which is responsive to the sensing device, can control the active discharge device. Specifically, the control circuit ensures that the active discharge device reduces the discharge current in response to an increased charging current, and increases the discharge current in response to a decreased charging current.

A peak detector can be implemented, in one embodiment, with six n type transistors (e.g. NMOS or npn transistors), two p-type transistors (e.g. PMOS or pnp transistors), a capacitor, and a current source. The first and second n-type transistors can receive a differential signal on their gates. The first p-type transistor (which can function as the sensing device) can be connected between a first voltage source (e.g. VDD) and the commonly connected drains of the first and second n-type transistors. The third n-type transistor (which can function as the active discharge device) can be connected between a second voltage source (e.g. VSS) and the commonly connected sources of the first and second n-type transistors. The output terminal of the peak detector can be coupled to the drain of the third n-type transistor.

The remaining components can be used to implement the control circuit that receives a signal from the sensing device and, based on that signal, controls the active discharge device. In one embodiment, the capacitor (which can function as the storage device) can be connected between the output terminal and the second voltage source. The current source can be connected between the first voltage source and a first node. The fourth n-type transistor can have its source connected to the second voltage source and its drain/gate connected to the first node as well as the gate of the third n-type transistor. The second p-type transistor can have its source connected to the first voltage source and its gate connected to the gate of the first p-type transistor. The fifth n-type transistor can have its source connected to the second voltage source and its drain connected to the drain of the second p-type transistor. The sixth n-type transistor can have its source connected to the second voltage source, its drain connected to the first node, and its gate connected to the gate of the fifth n-type transistor.

In one embodiment, a peak detector can receive a single signal instead of a differential signal. In this case, one of the transistors in the transistor pair receiving the differential signal can be grounded. Alternatively, for embodiments where differential signal detection is not desired, one of the transistors in the transistor pair can be eliminated.

DETAILED DESCRIPTION OF THE FIGURES

Many applications can benefit from a fast response peak detector. To decrease its charge time, a conventional peak detector can increase the size of its differential signal input devices. To decrease its discharge time, a conventional peak detector can increase its bias current. Unfortunately, using both larger differential signal input devices and a higher bias current creates an undesirable large ripple in the output signal of the peak detector.

Figure 2:
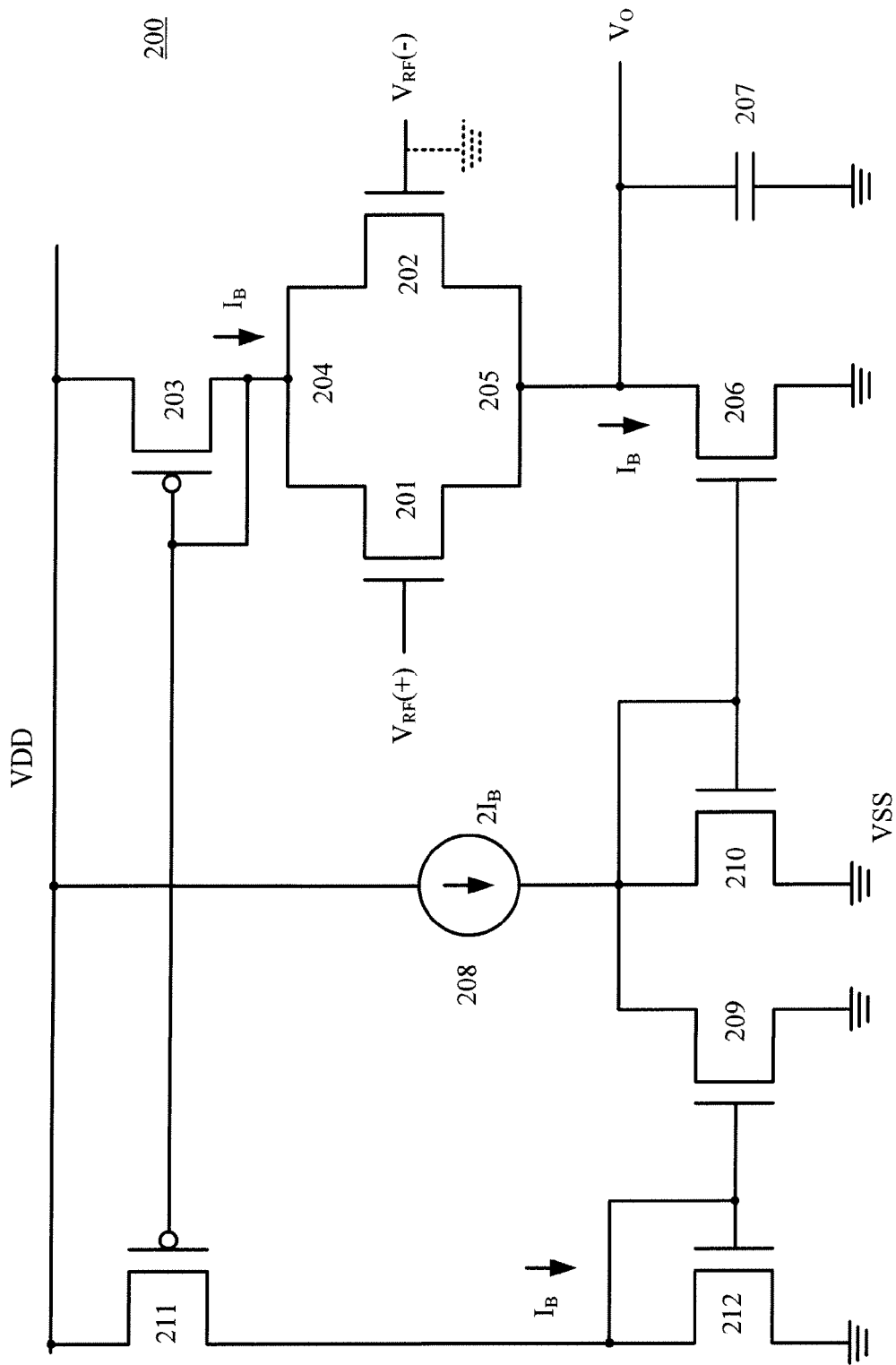
FIG. 2 illustrates a peak detector that can advantageously increase the bandwidth while minimizing ripple on the output signal.

FIG. 2 illustrates a peak detector 200 that can advantageously increase (e.g. double) its bandwidth (i.e. its charging and discharging speed) while minimizing the ripple of the output signal. In this embodiment of peak detector 200, the RF differential signal $V_{RF}(+)$ and $V_{RF}(-)$, whose envelope must be detected, is connected to the gates of NMOS transistors 201 and 202. A PMOS transistor 203 has a gate and a source connected to a voltage source VDD and a drain connected to a node 204. Transistors 201 and 202 are connected in parallel between node 204 and a node 205, which provides an output signal $V_o$. An NMOS transistor 206 and a capacitor 207 are connected in parallel between node 205 and a voltage source VSS.

In peak detector 200, a current source 208 and an NMOS transistor 210 are connected in series between voltage sources VDD and VSS. The drain and gate of NMOS transistor 210 are connected to the gate of NMOS transistor 206. Additionally, an NMOS transistor 209 is connected between the drain of NMOS transistor 210 and voltage source VSS. In a second compensation path, a PMOS transistor 211 and an NMOS transistor 212 are connected in series between voltage sources VDD and VSS, wherein the gate of PMOS transistor 211 is connected to the gate of PMOS transistor 203 and the gate and drain of NMOS transistor 212 are connected to a gate of NMOS transistor 209.

In a steady state phase of peak detector 200, bias current $I_B$ flows through PMOS transistors 203 and 211 as well as NMOS transistors 212, 209, 210, and 206 (noting that $2I_B$, which is provided by current source 208, is divided between NMOS transistors 209 and 210).

When the peak voltage of the RF differential signal $V_{RF}(+)/V_{RF}(-)$ suddenly decreases, thereby decreasing the current through transistors 201 and 202, capacitor 207 will start discharging (a discharge phase of peak detector 200). PMOS transistor 203 can sense this discharge via the reduced current through NMOS transistors 201 and 202 and responds by reducing its current. In the above-described configuration, PMOS transistor 211 and NMOS transistors 212 and 209, each in turn, similarly respond by decreasing their current. In this case, NMOS transistor 210 actually increases its current provided by current source 208, i.e. up to $2I_B$. This increased current in turn causes NMOS transistor 206 to increase its current, thereby accelerating the discharge of capacitor 207. In fact, for large input voltage peak reduction, PMOS transistor 203 (as well as PMOS transistor 211 and NMOS transistors 212 and 209) can turn off completely and the current through NMOS transistor 206 (and NMOS transistor 210) can become $2I_B$, thereby doubling the discharging rate.

Thus, NMOS transistors 201 and 202 can be characterized as RF signal input devices, capacitor 207 can be characterized as a storage device, and PMOS transistor 203 can be characterized as a sensing device. Moreover, as described, PMOS transistor 211, NMOS transistors 209 and 211, and current source 208 can be characterized as a dynamic control circuit activated by the sensing device. This dynamic control circuit can advantageously control the current through NMOS transistor 206. Therefore, NMOS transistor 206 can be characterized as an active discharge device. In this embodiment of peak detector 200, because the current through the active discharge device can be doubled, the discharge rate of the storage device can also be doubled.

In contrast, when the peak voltage of the RF differential signal $V_{RF}(+)/V_{RF}(-)$ suddenly increases, thereby increasing the current through NMOS transistor 201 or NMOS transistor 202, capacitor 207 will start charging (a charging phase of peak detector 200). PMOS transistor 203 can sense this charging via the increased current through NMOS transistors 201 and 202 and thus its current is also increased. In the above-described configuration, PMOS transistor 211 and NMOS transistors 212 and 209, each in turn, similarly respond by increasing their current. In this case, NMOS transistor 210 actually decreases its current provided by current source 208, i.e. down Lo zero. This decreased current in turn causes NMOS transistor 206 to decrease its current, thereby accelerating the charging of capacitor 207. In fact, for a large increase at the peak of the RF differential signal $V_{RF}(+)/V_{RF}(-)$, NMOS transistor 206 can temporarily turned off completely, thereby eliminating any discharge current, until capacitor 207 is charged close to its final value.

Peak detector 200 provides significant advantages over conventional peak detectors, e.g. peak detector 100. For example, peak detector 200 can accelerate a charging/discharge phase (i.e. increase bandwidth) by controlling the current through its active discharge device. Further, this increased bandwidth can be achieved without increasing the size of the transistors in the peak detector. Therefore, peak detector 200 can significantly increase (e.g. double) the bandwidth while minimizing ripple on its output (i.e. not increasing the ripple generated during steady state).

Figure 3:
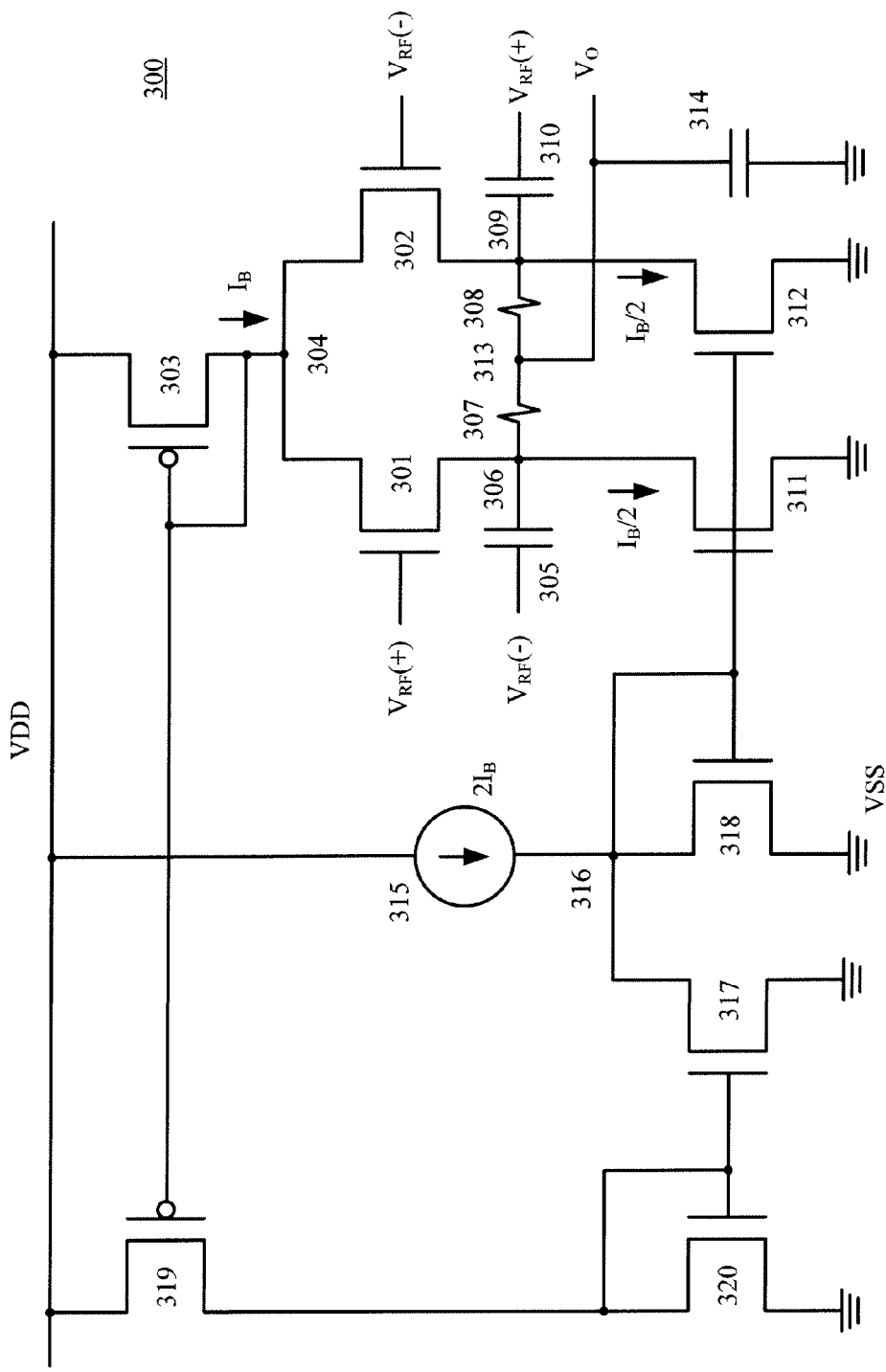
FIG. 3 illustrates another peak detector that can advantageously increase the bandwidth while minimizing ripple on the output signal.

FIG. 3 illustrates another peak detector 300 that can advantageously increase its bandwidth while keeping the ripple of the output signal the same. In this embodiment of peak detector 300, the RF differential signal $V_{RF}(+)$ and $V_{RF}(-)$, whose envelope must be detected, is connected to the gates of NMOS transistors 301 and 302. A PMOS transistor 303 has a source and a gate connected to a voltage source VDD and a drain connected to a node 304. Transistor 301 is connected between node 304 and a node 306, whereas NMOS transistor 302 is connected between node 304 and a node 309. Resistors 307 and 308 are connected in series between nodes 306 and 309.

A capacitor 305 has one terminal for receiving the negative differential signal $V_{RF}(-)$ and another terminal connected to node 306. Another capacitor 310 has one terminal for receiving the positive differential signal $V_{RF}(+)$ and another terminal connected to node 309. An NMOS transistor 311 is connected between node 306 and a second voltage source VSS. Another NMOS transistor 312 is connected between node 309 and the second voltage source VSS. A capacitor 314 is connected between a node 313 and the second voltage source. Node 313, which is located between resistors 307 and 308, provides an output signal $V_o$.

A current source 315 and an NMOS transistor 318 are connected in series between voltage sources VDD and VSS. The drain and gate of NMOS transistor 318 are connected to the gate of NMOS transistor 311. A PMOS transistor 319 and an NMOS transistor 320 are also connected in series between voltage sources VDD and VSS, wherein the gate of PMOS transistor 319 is connected to the gate of PMOS transistor 303 and the gate and drain of NMOS transistor 320 are connected to a gate of an NMOS transistor 317, which is connected between the drain of NMOS transistor 318 (at node 316) and voltage source VSS.

Note that in this configuration, both NMOS transistors 311 and 312 can be characterized as the active discharge device. Therefore, in steady state, each NMOS transistor carries a bias current of $I_B/2$. Capacitors 305/310 and resistors 307/308 can be advantageously used to provide common mode signal rejection.

Peak detector 300 provides similar advantages to that discussed above with respect to peak detector 200. For example, peak detector 300 also can accelerate a charging/discharge phase (i.e. increase bandwidth) by controlling the current through its active discharge device. Further, this increased bandwidth can be achieved without increasing the size of the transistors in the peak detector. Therefore, peak detector 300 can significantly increase (e.g. double) the bandwidth while minimizing ripple on its output (i.e. not increasing the ripple generated during steady state).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, in the embodiment described above, the PMOS transistors can have the same size and the NMOS transistors can have the same size. In another embodiment, the size of the PMOS transistor and the NMOS transistor connected in series between the two voltage sources in the control circuit (e.g. 211/212 or 319/320) can be scaled together by any factor, which will also scale the current through that branch by the same factor.

Moreover, although CMOS transistors are described above, a peak detector can also be implemented with bipolar devices. For example, PMOS transistors could be replaced with pnp transistors, and NMOS transistors could be replaced with npn transistors. Therefore, a "p-type" transistor could refer to a PMOS or pnp transistor. Similarly, an "n-type" transistor could refer to an NMOS or npn transistor.

Moreover, although the current source described above provides a bias current of $2I_B$ to effectively double the bandwidth of the peak detector, other bias currents can be used to provide a desired bandwidth. Note that the above-described peak detectors can be used with any type of differential signal, e.g. radio frequency (RF), intermediate frequency (IF), audio frequency, etc.

In one embodiment, a peak detector ran receive a single signal instead of a differential signal. In this case, one of the transistors in the transistor pair receiving the differential signal can be grounded. For example, referring to FIG. 2, the gate of NMOS transistor 202, instead of receiving $V_{RF}(-)$, could be grounded (as indicated by the ground symbol with dotted lines). Alternatively, for embodiments where differential signal detection is not desired, one of the transistors in the transistor pair can be eliminated. For example, once again referring to FIG. 2, NMOS transistor 202 could be eliminated in such an embodiment. Accordingly, it is intended that the scope of the invention be defined by the following Claims and their equivalents.

The invention claimed is:

1. A peak detector comprising:
   a differential signal input circuit;
   a storage device connected to the differential signal input circuit, the storage device charging/discharging based on a charging current provided by the differential signal input circuit;
   a sensing device for sensing the charging current;
   an active discharge device connected to the storage device; and
   a control circuit, responsive to the sensing device, for controlling the active discharge device, the control circuit including a plurality of current mirrors,
   wherein the active discharge device reduces a discharge current in response to an increased charging current, and wherein the active discharge device increases a discharge current in response to a decreased charging current.

2. The peak detector of claim 1, wherein the sensing device includes a p-type transistor.

3. The peak detector of claim 1, wherein the active discharge device include an n-type transistor.

4. A peak detector comprising:
   an RF differential signal input circuit;
   a capacitor connected to the RF differential signal input circuit, the capacitor charging/discharging based on a charging current provided by the RF differential signal input circuit;
   a sensing device for sensing the charging current;
   an active discharge device connected to the capacitor; and
   a control circuit, responsive to the sensing device, for controlling the active discharge device, the control circuit including a plurality of current mirrors,
   wherein the active discharge device reduces a discharge current in response to an increased charging current, and wherein the active discharge device increases a discharge current in response to a decreased charging current.

5. The peak detector of claim 4, wherein the sensing device includes a p-type transistor.

6. The peak detector of claim 4, wherein the active discharge device include an n-type transistor.

7. A peak detector comprising:
   a first n-type transistor having a source, a drain, and a gate, the gate for receiving a positive differential signal;
   a second n-type transistor having a source, a drain, and a gate, the gate for receiving a negative differential signal;

a first p-type transistor having a source, a drain, and a gate, the source connected to a first voltage source, and the drain connected to the drains of the first and second n-type transistors;

a third n-type transistor having a source, a drain, and a gate, the source connected to a second voltage source, and the drain connected to the sources of the first and second n-type transistors and an output terminal;

a capacitor connected between the output terminal and the second voltage source;

a current source connected between the first voltage source and a first node;

a fourth n-type transistor having a source, a drain, and a gate, the source connected to the second voltage source, and the drain and gate connected to the first node and the gate of the third n-type transistor;

a second p-type transistor having a source, a drain, and a gate, the source connected to the first voltage source, and the gate connected to the gate of the first p-type transistor;

a fifth n-type transistor having a source, a drain, and a gate, the source connected to the second voltage source, and the drain and gate connected to the drain of the second p-type transistor; and a sixth n-type transistor having a source, a drain, and a gate, the source connected to the second voltage source, the drain connected to the first node, and the gate connected to the gate of the fifth n-type transistor.

8. A peak detector comprising:

a first n-type transistor having a source, a drain, and a gate, the gate for receiving a positive differential signal;

a second n-type transistor having a source, a drain, and a gate, the gate for receiving a negative differential signal;

a first p-type transistor having a source, a drain, and a gate, the source connected to a first voltage source, and the drain and the gate connected to the drains of the first and second n-type transistors;

a third n-type transistor having a source, a drain, and a gate, the source connected to a second voltage source, and the drain connected to the source of the first n-type transistor;

a fourth n-type transistor having a source, a drain, and a gate, the source connected to the second voltage source, and the drain connected to the source of the second n-type transistor;

a first capacitor having a first terminal for receiving the negative differential signal and a second terminal connected to the source of the first n-type transistor as well as the drain of the third n-type transistor;

a second capacitor having a first terminal for receiving the positive differential signal and a second terminal connected to the source of the second n-type transistor as well as the drain of the fourth n-type transistor;

a first resistor and a second resistor connected in series between the second terminals of the first and second capacitors;

a first node connected to an output terminal;

a third capacitor connected between the first node and the second voltage source;

a current source connected between the first voltage source and a second node;

a fifth n-type transistor having a source, a drain, and a gate, the source connected to the second voltage source, and the drain and the gate connected to the gates of the third and fourth n-type transistors;

a second p-type transistor having a source, a drain, and a gate, the source connected to the first voltage source, and the gate connected to the gate of the first p-type transistor;

a sixth n-type transistor having a source, a drain, and a gate, the source connected to the second voltage source, and the drain and source connected to the drain of the second p-type transistor; and a seventh n-type transistor having a source, a drain, and a gate, the source connected to the second voltage source, the drain connected to the second node, and the gate connected to the gate of the sixth n-type transistor.

* * * * *